(12) United States Patent
Chiu

(10) Patent No.: US 7,088,430 B2
(45) Date of Patent: Aug. 8, 2006

(54) PHOTOMASK POSITIONING APPARATUS

(75) Inventor: Ming-Chien Chiu, Taipei (TW)

(73) Assignee: Gudeng Precision Industrial Co., Ltd., Taipei Hsien (TW)

( * ) Notice: Subject to any disclaimer, the term of this patent is extended or adjusted under 35 U.S.C. 154(b) by 63 days.

(21) Appl. No.: 10/710,542

(22) Filed: Jul. 20, 2004

(65) Prior Publication Data
US 2005/0200829 A1 Sep. 15, 2005

(30) Foreign Application Priority Data
Mar. 11, 2004 (TW) ................ 093106493

(51) Int. Cl.
G03B 27/62 (2006.01)
G03B 27/58 (2006.01)
G03B 27/42 (2006.01)
(52) U.S. Cl. ............. 355/75; 355/72; 355/53
(58) Field of Classification Search ......... 355/72, 355/75
See application file for complete search history.

(56) References Cited

U.S. PATENT DOCUMENTS

| | | | | |
|---|---|---|---|---|
| 5,663,786 A | * | 9/1997 | Miyamori | 355/72 |
| 6,157,440 A | * | 12/2000 | Ikeda | 355/75 |
| 6,176,023 B1 | * | 1/2001 | Doche | 34/451 |
| 6,252,654 B1 | * | 6/2001 | Kaya | 355/408 |
| 6,678,075 B1 | * | 1/2004 | Tsai et al. | 358/487 |
| 6,806,943 B1 | * | 10/2004 | Barringer et al. | 355/75 |
| 2002/0012109 A1 | * | 1/2002 | Suzuki et al. | 355/53 |
| 2002/0038773 A1 | * | 4/2002 | Fujimori et al. | 206/454 |
| 2002/0129707 A1 | * | 9/2002 | Tanaka et al. | 95/273 |
| 2002/0131031 A1 | * | 9/2002 | Tsuchida et al. | 355/72 |
| 2005/0157288 A1 | * | 7/2005 | Van Peski et al. | 355/75 |

* cited by examiner

Primary Examiner—W. B. Perkey
Assistant Examiner—Vivian Nelson

(57) ABSTRACT

A photomask positioning apparatus comprises a positioning device having a base, one end of which comprises a bended fixed portion connected to a bottom of the containing space and the other of which is away from the fixed portion comprises a bended positioning portion such that a photomask can be positioned between the positioning portion set at the two sides of the containing space.

13 Claims, 10 Drawing Sheets

PHOTOMASK POSITIONING APPARATUS

CROSS REFERENCE TO RELATED APPLICATIONS

This application claims the priority benefit of Taiwan patent application number 093106493 filed on Mar. 11, 2004.

BACKGROUND OF INVENTION

1. Field of the Invention

The present invention relates to a photomask positioning apparatus and more particularly to a photomask positioning apparatus for a photomask box comprising a positioning device and a holding device in a containing space of a lid such that the photomask can be positioned between the positioning devices and the holding devices at two sides of the containing space to facilitate a robotic arm to take out the photomask without frictions with the fixing devices so that damage to the photomask can be reduced.

2. Description of the Related Art

After entering into the $21^{st}$ century, humans life is entering into a field of a digital era. Nowadays, many articles and tools in humans life are substituted substantially by digital high technical products and making people have more conveniences and enjoy the civilized advances of the high technologies. However, in the digital era, most electronic products and tools are related to digital technologies or are controlled by high technical IC chips to achieve the objectives of quickness and automation. Therefore, people living in the digital technical field era have to control a variety of high technical technology products and tools by further improved digital knowledge and skills. Wherein the high technological IC chips are very important elements. Since IC chips are constituted of very high precision integrated circuit, and its manufacturing processes are using high precision machines to perform high precision integrating processes on silicon wafers by using photomasks in an environment of a clean room. The machines, manufacturing factories and manufacturing cost are very expensive. Therefore, in the process of manufacturing wafers, yield factors of the products can determine whether a semiconductor factory can profit. Thus, raising the yield factors of the products is the most important subject of every manager of the semiconductor factories.

The objective of the SMIF system is to reduce particles flux in warehousing and transportation processes of a semiconductor process. The method to achieve this objective partly comprises ensuring gaseous medium (e.g. air or nitrogen) surrounding the wafer relative to the wafer is basically fixed in warehousing and transportation processes and ensuring particles in a surrounding environment do not enter an environment surrounding to the wafer. The SMIF system is capable of using little gas without particles to provide a clean environment for articles. The activation, airflow direction, and outside pollution of the gas are all need to be controlled.

However, to avoid wafers or photomasks from damaging, the photomask boxes are used to transport wafers or photomasks. Besides, limiting device are set in the photomask boxes to limit the positions of the photomasks to prevent the photomasks from shifting because of shaking or other factors in transporting process to damage the photomasks. However, since robotic arms are used to take or move the photomasks in the wafer manufacturing process, the limiting devices cannot totally limit the moving ranges of the photomasks in the photomask boxes, and a predetermined moving space has to be preserved between the photomask and the limiting device. Besides, to prevent the photomasks from shifting when the robotic arms take the photomask, and the photomask cannot be accurately placed onto the robotic arms. Referring to FIGS. 9 and 10, a blocking mean B1 set at one side in a lid B comprises a plurality of levers B2. An activating element B3 is set at the other side of the plurality of levers B2. A depending element B4 is fixed on the activating element B3. When the lid B covers on a substrate C, the depending element B4 is positioned against a side of a photomask board C1 on the substrate C so that the photomask board C1 can be properly positioned. However, when using aforementioned photomask box A, there are still many shortcomings described.

1. When the depending element B4 is positioned against the side of the photomask board C1, they generate micro-fragments in friction processes to pollute and damage the photomask board C1.

2. When the blocking means B1 uses the plurality of levers B2 to connect the activating element B3, the micro-fragments will be generated easily because of friction in a contacting area between the levers B2 and the activating element B3.

3. When the blocking means B1 closes the lid B using the substrate C, the activating element B3 contacts the substrate C to move upward and rightward to achieve the function of the depending element B4 against the photomask board C. The micro-fragments will be generated at the activating element B3 contacting with the substrate C because of the opening/closing, shaking of the photomask box A and frictions during transport action.

SUMMARY OF INVENTION

According to an aspect of the present invention, a photomask box comprises a lid and a substrate. A holding device is set at a side of the lid. The holding device comprises a base, and the base can be locked in the lid by a locking element. A connecting element is set on a surface of one side of the base. The connecting element is pivotally set with a spindle. The spindle pivotally set on a connecting end of one end of the holding portion. The base comprises a shifting end at the other side away from the connecting end so that the shifting end can rotate, twist, transform and shift. When the lid covers the substrate, the holding portion depends at the side of the photomaks so that shaking or frictions will not occur easily.

According to another aspect of the present invention, the connecting end and the shifting end of the holding portion are pivotally set by a central axis. Besides, the central axis comprises a plurality of holding wheels.

According to another aspect of the present invention, the positioning devices set at two sides of the containing space of the lid is used to effectively fix the photomask between the fixing devices set at two sides of the substrate to prevent the photomask from shaking in the photomask box and generate frictions to reduce photomask damaged and effectively suppress generation of micro-fragments.

According to another aspect of the present invention, the positioning device is made of rubber or plastic material to reduce the cost.

BRIEF DESCRIPTION OF DRAWINGS

For a more complete understanding of the present invention, reference will now be made to the following detailed description of preferred embodiments taken in conjunction with the following accompanying drawings.

DETAILED DESCRIPTION

Figure 1:
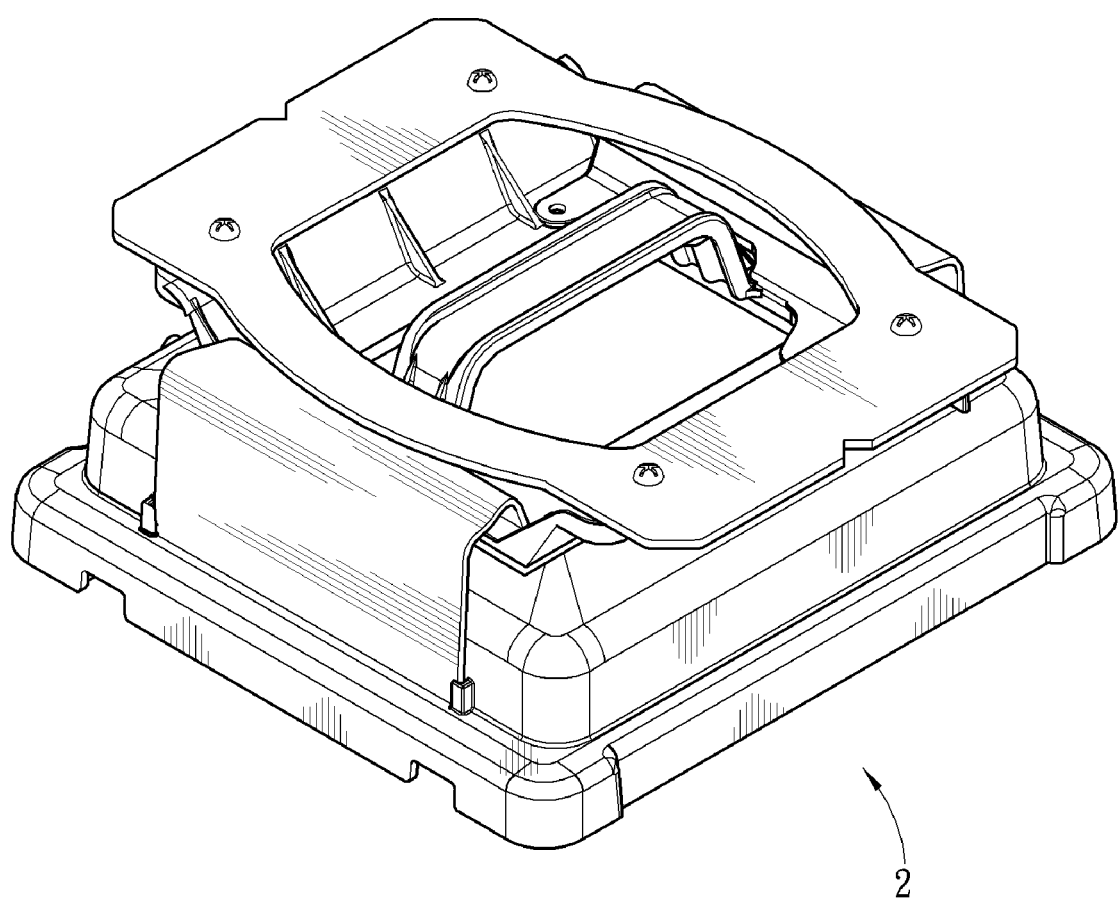
FIG. 1 is an elevational view of the present invention.
Figure 2:
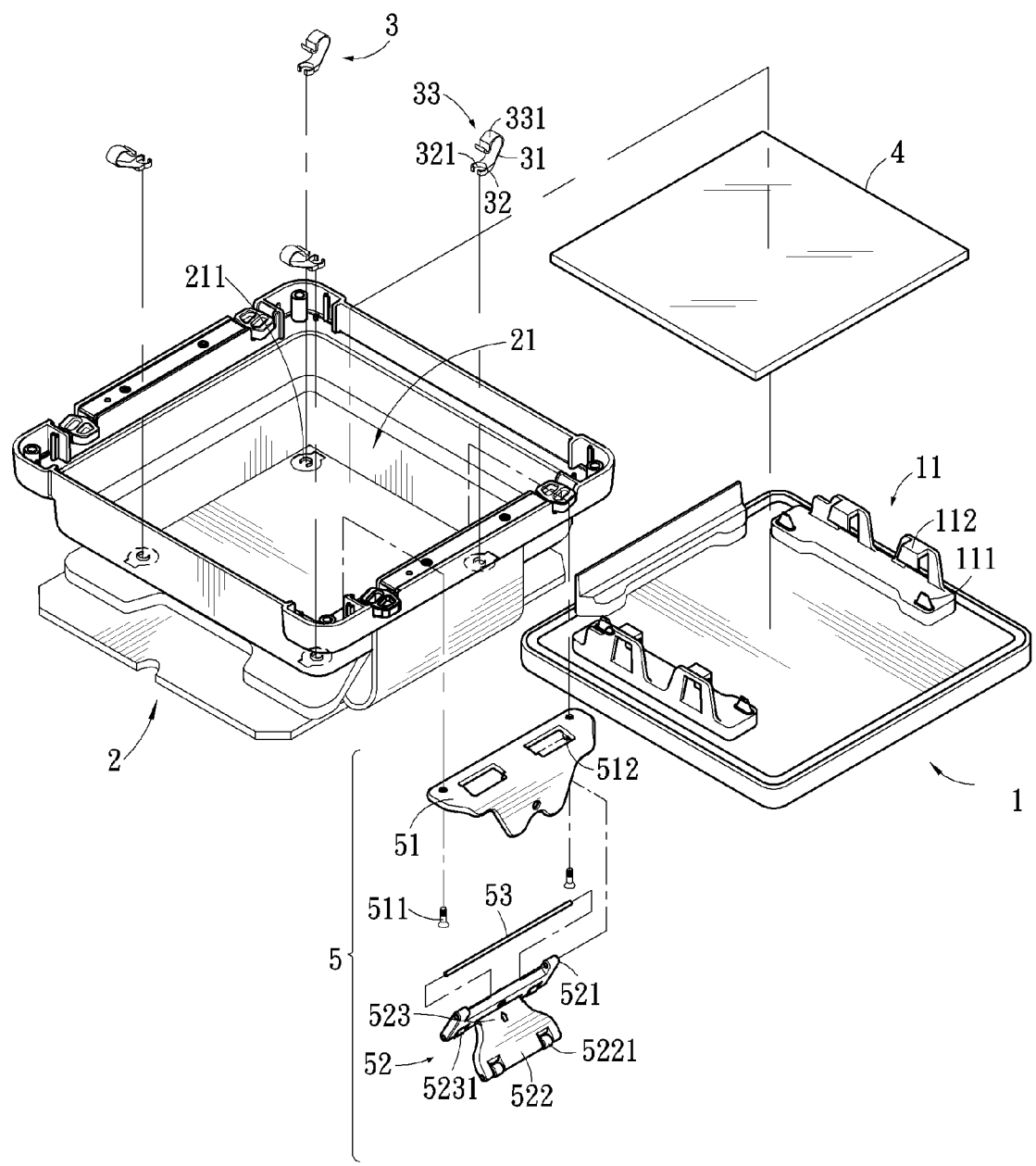
FIG. 2 is an exploded view of the present invention.
Figure 3:
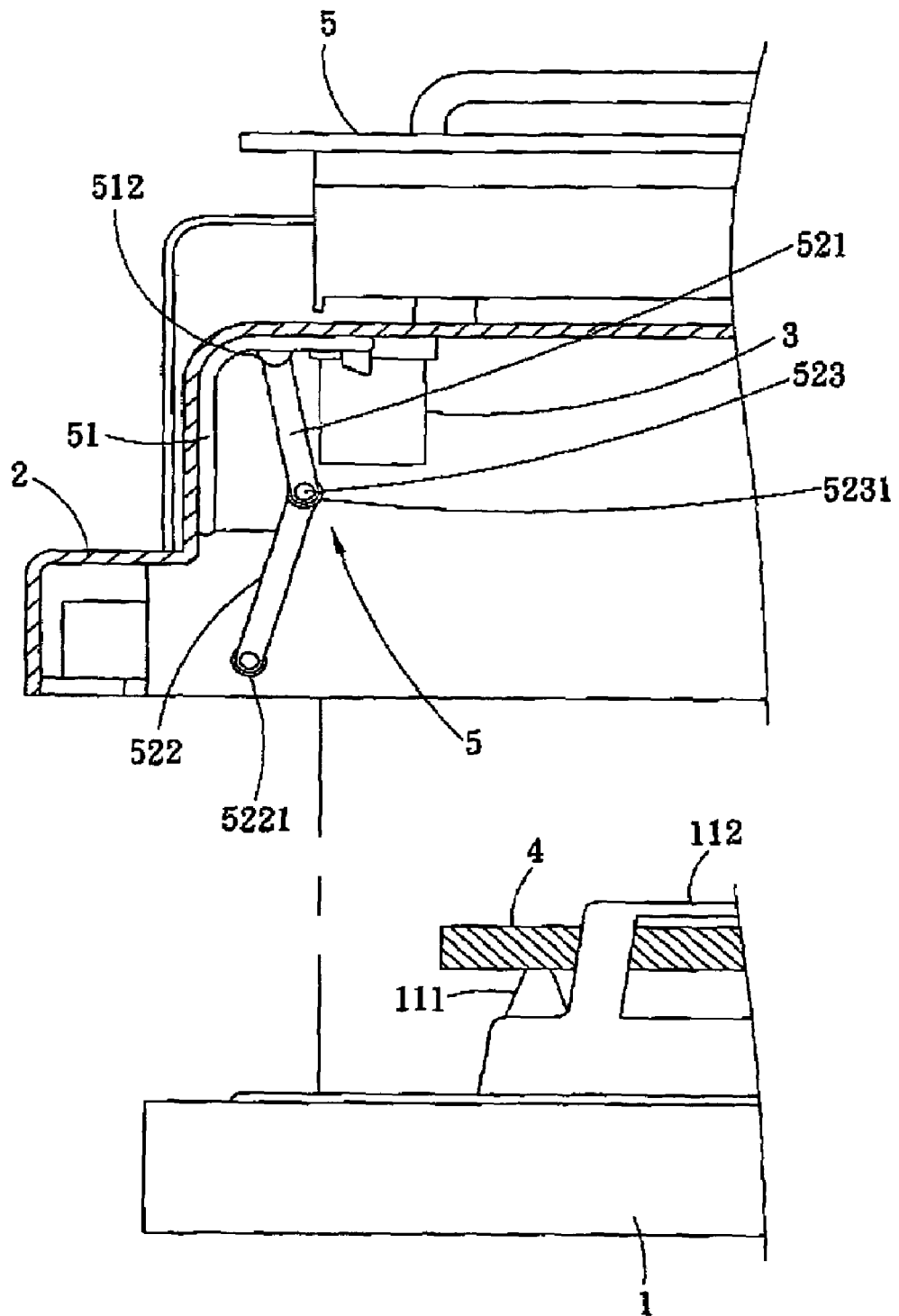
FIG. 3 is a side-view before operating (A) of the present invention.
Figure 4:
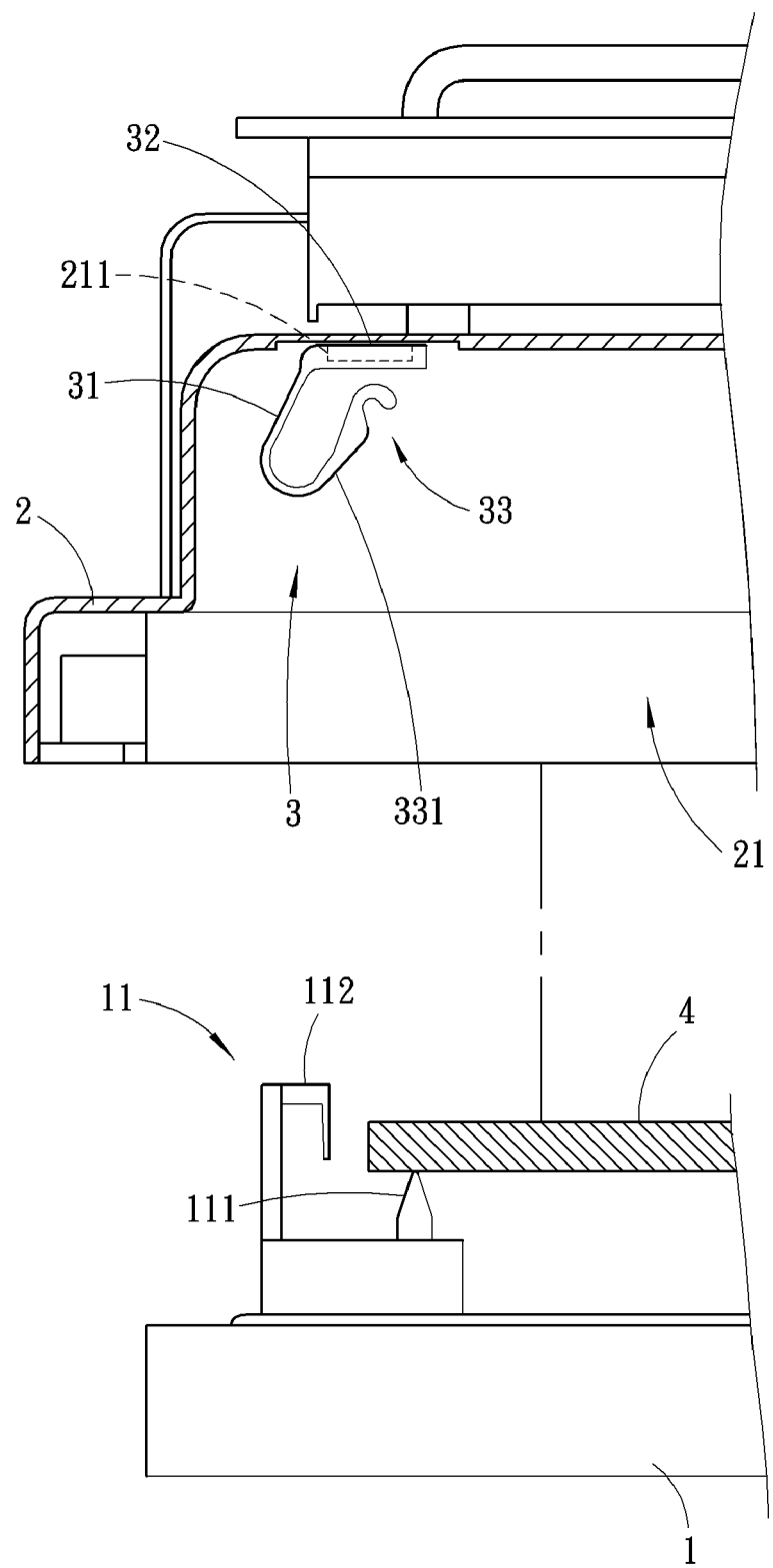
FIG. 4 is a side-view before operating (B) of the present invention.
Figure 5:
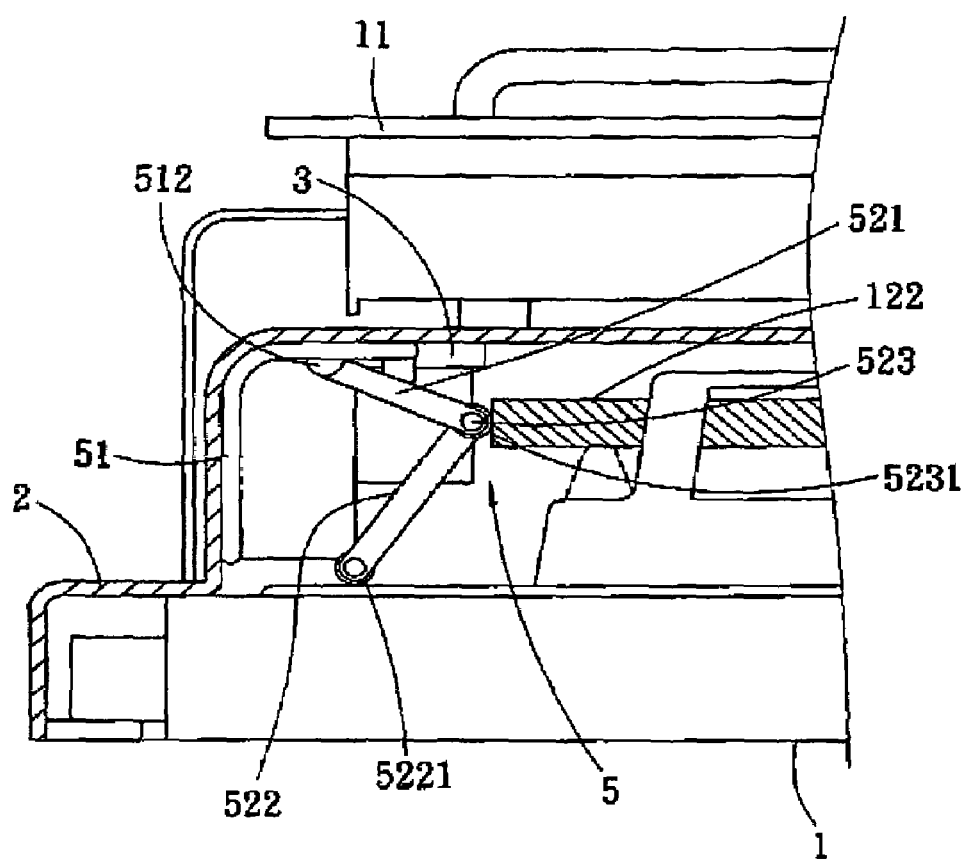
FIG. 5 is a side-view profile diagram after operating (A) of the present invention.
Figure 6:
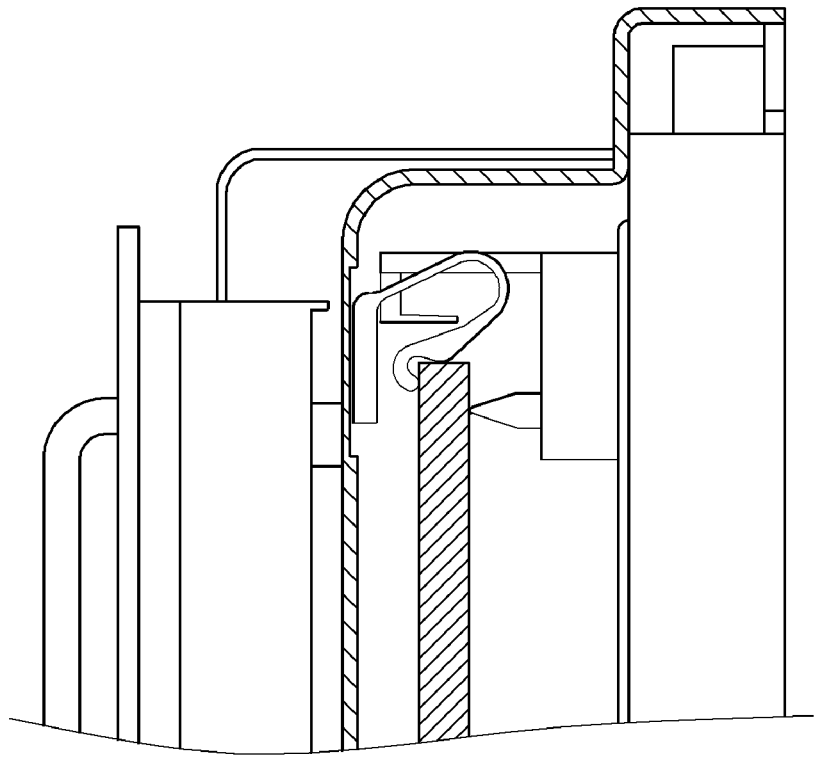
FIG. 6 is a side-view after operating (B) of the present invention.

Referring to FIGS. 1 and 2, photomask box comprises a substrate 1, a lid 2, a plurality of positioning devices 3, a photomask 4 and a holding device 5.

Fixing devices 11 are set two sidewalls of the substrate 1. Each fixing device 11 convexly sets a holding element 111 for placing the photomask 4, and one side of the holding element 111 comprises a plurality of limiting plates 112.

The lid 2 has a containing space 21 for receiving the photomask 4, and a plurality of positioning axles 211 are convexly set at a bottom of the containing space 21.

The positioning device 3 comprises a base 31 and a fixing portion 32 is set one end of the base 31. The fixing portion 32 has a positioning slot 321 fixed at the positioning axle 211 of the lid 2. A positioning portion 33 is set at other end away from the fixing portion 32, and the positioning portion 33 comprises a guiding surface 331.

A base 51 of the holding device 5 can be locked at a surface of one side of the lid 2 by a locking element 511. A connecting element 512 set at a surface of one side of the base 51 is pivotally set a spindle 53 and the spindle 53 is pivoted at a connecting element 512 of a holding portion 52. The holding portion 52 comprises a shifting end 522 at the other side away from the connecting end 521. The connecting end 521 and the shifting end 522 are rotationally connected by a central axis 523 having a plurality of holding wheels 5231 so that the shifting end 522 can perform shifting, twisting and transforming movement via the central axis 523. The shifting end 522 comprises a plurality of shifting wheels 5221 at the other side away from the central axis 523. The plurality of shifting wheels 5221 can be made of a soft material or a Polyetherether-ketone (PEEK) plastic material.

Referring to FIGS. 3, 4, 5 and 6, when operating, the photomask 4 is placed between the fixing devices 11 at two sides of the surface of the substrate 1, and the photomask 4 and the substrate 1 kept at a predetermined distance by the holding elements 11 to facilitate the robotic arm inserting and taking out in the subsequent stages. Then, the lid 2 covers the substrate 1. Meanwhile, the guiding surface 331 of the positioning device 3 will guide the photomask 4 to move to position. When the lid 2 is totally sealed, the photomask 4 is positioned between the positioning portion 33 of two sides of the positioning device 3, and the positioning portions 33 and the holding elements 111 will clip the photomask 4 from top and bottom so that the photomask 4 can be firmly fixed in the photomask box without con- tacting with the limiting plates 112 at two sides of the substrate 1. At the same time, the holding device 5 holds the substrate 1 by the shifting wheels 5221 of the shifting end 522 and makes the shifting wheels 5221 move on the substrate 1. Since the shifting wheels 5221 are made of soft material, the micro-fragments due to frictions will not be generated so that the clean state in the photomask box can be maintained. The connecting end 521 pivoted by the central axis 523 at the other side of the shifting end 522 is driven by the shifting end 522 and is skewed toward a side so that the connecting end 521 and the shifting end 522 will be twisted and transformed to a V shape. The plurality of holding wheels 5231 on the central axis 523 of the pivot position of the connecting end 521 and the shifting end 522 protrude out at the pointed position of the V shape, and thus the holding wheels 5231 convexly at the side of the photomask 4 to achieve an effect of holding the photomask 4 in position.

When the holding device 5 is twisted and transformed to the V shape, the connecting end 521 connects in the lid 2, and the shifting end 522 holds on the substrate 1. The central axis 523 of the connecting end 521 and the shifting end 522 holds against the side of the photomask 4 by the holding wheels 5231 so that the holding device 5 formed in the fixed position without generating bias or shakes. Meanwhile, the side of the photomask 4 is held and limited by the holding device 5, so the photomask 4 can be kept properly stabilized in the process during the transportation of moving the photomask box. Further, the holding device 5 sets a plurality of holding wheels 5231 on the central axis 523, and the holding wheels 5231 are made of a soft material. Therefore, when the holding wheels 5231 hold at the side of the photomask 4, they will not be friction 4 and the micro-fragments will not be generated so that the photomask box can be maintained in a clean vacuum state. Besides, when opening the lid 2, the photomask 4 is positioned in a correct position set by the positioning device 3 and the holding device 5 to facilitate the robotic arm to taking out the photomask 4.

Figure 7:
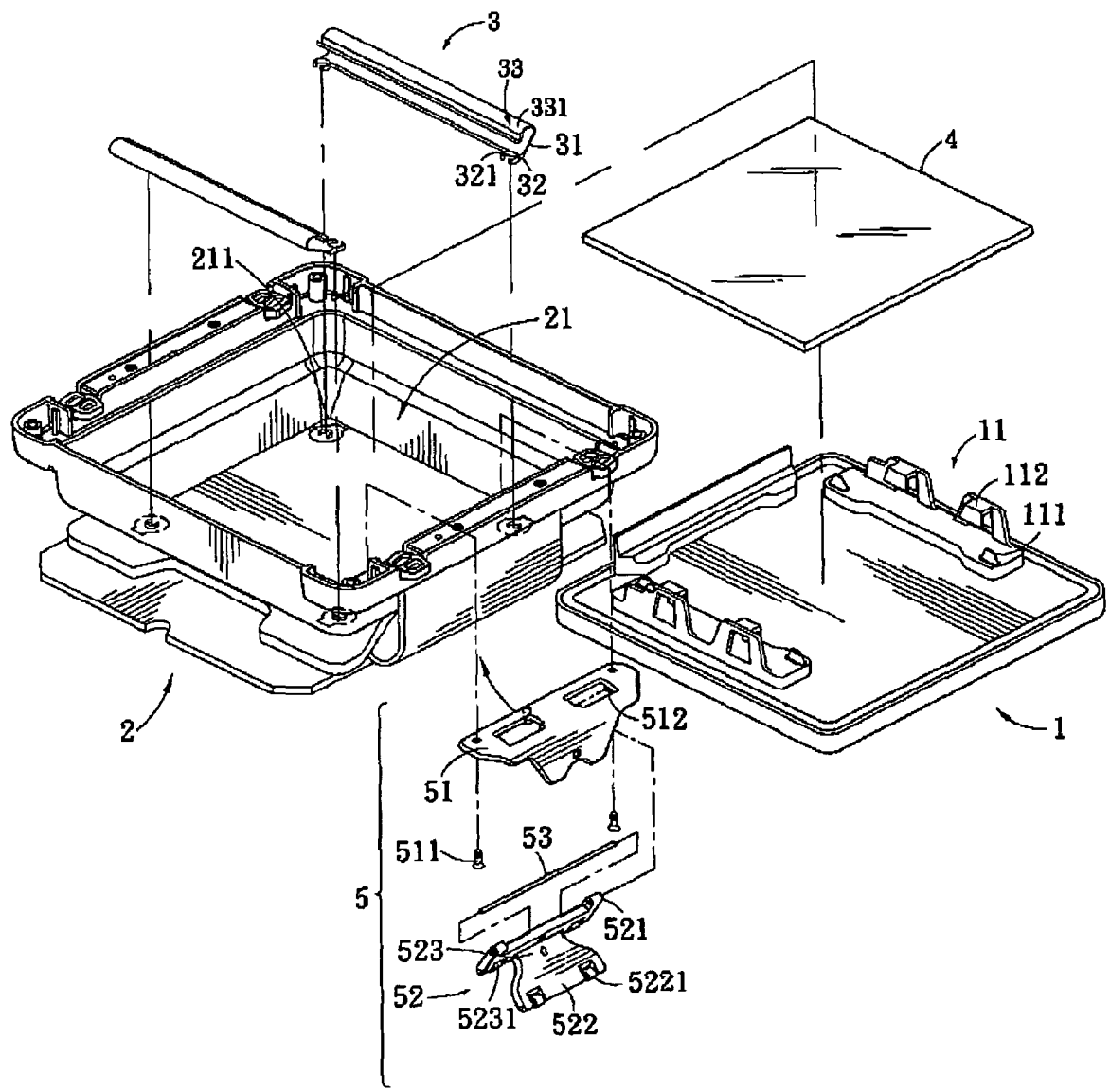
FIG. 7 is an elevational view of another embodiment of the present invention.

Referring to FIG. 7, the positioning device 3 can be comprised of a long shape to increase the contact surface area with the photomask 4 to further stabilize the photomask 4 in the photomask box.

Figure 8:
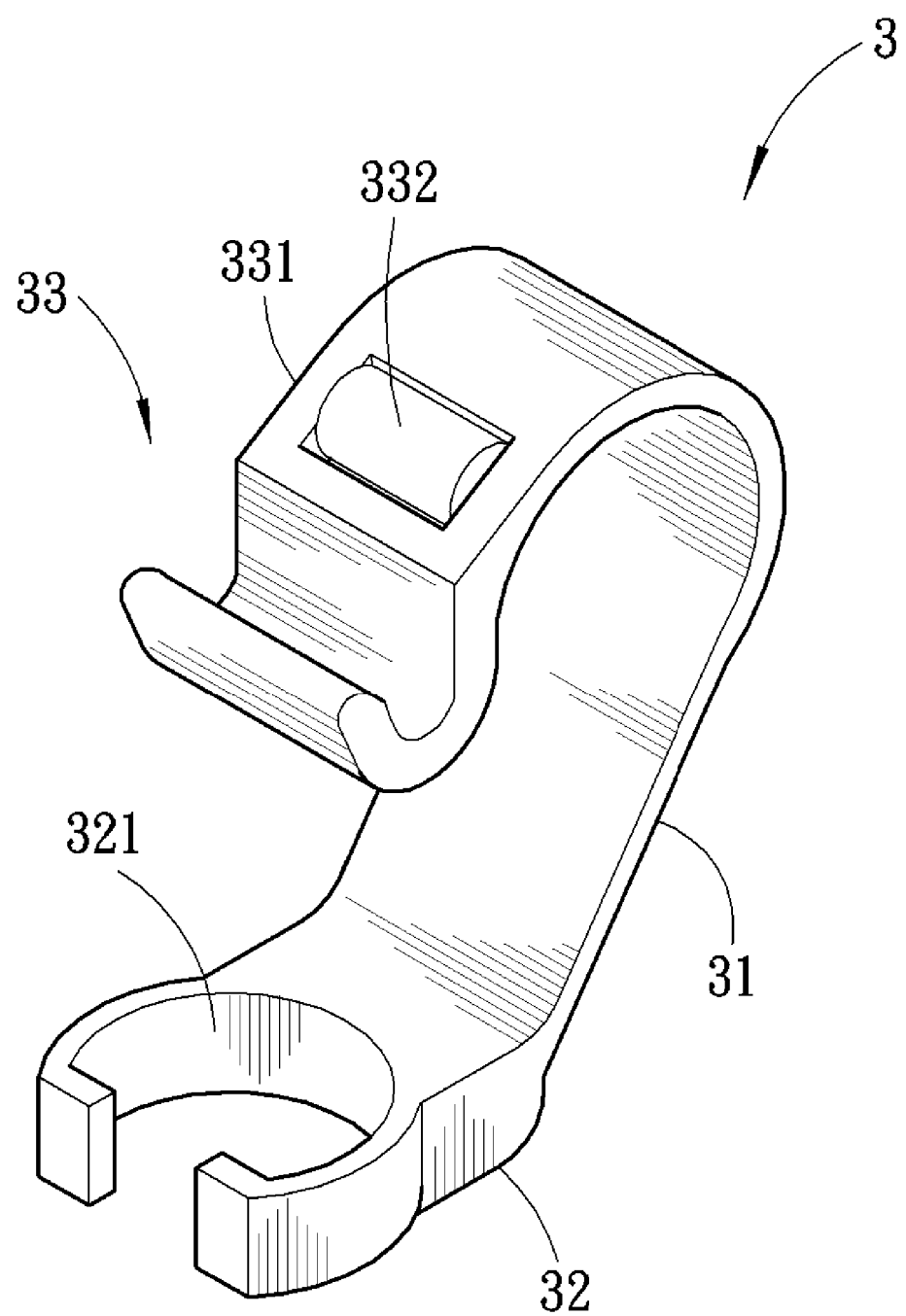
FIG. 8 is an elevational view of another embodiment of the present invention.
Figure 9:
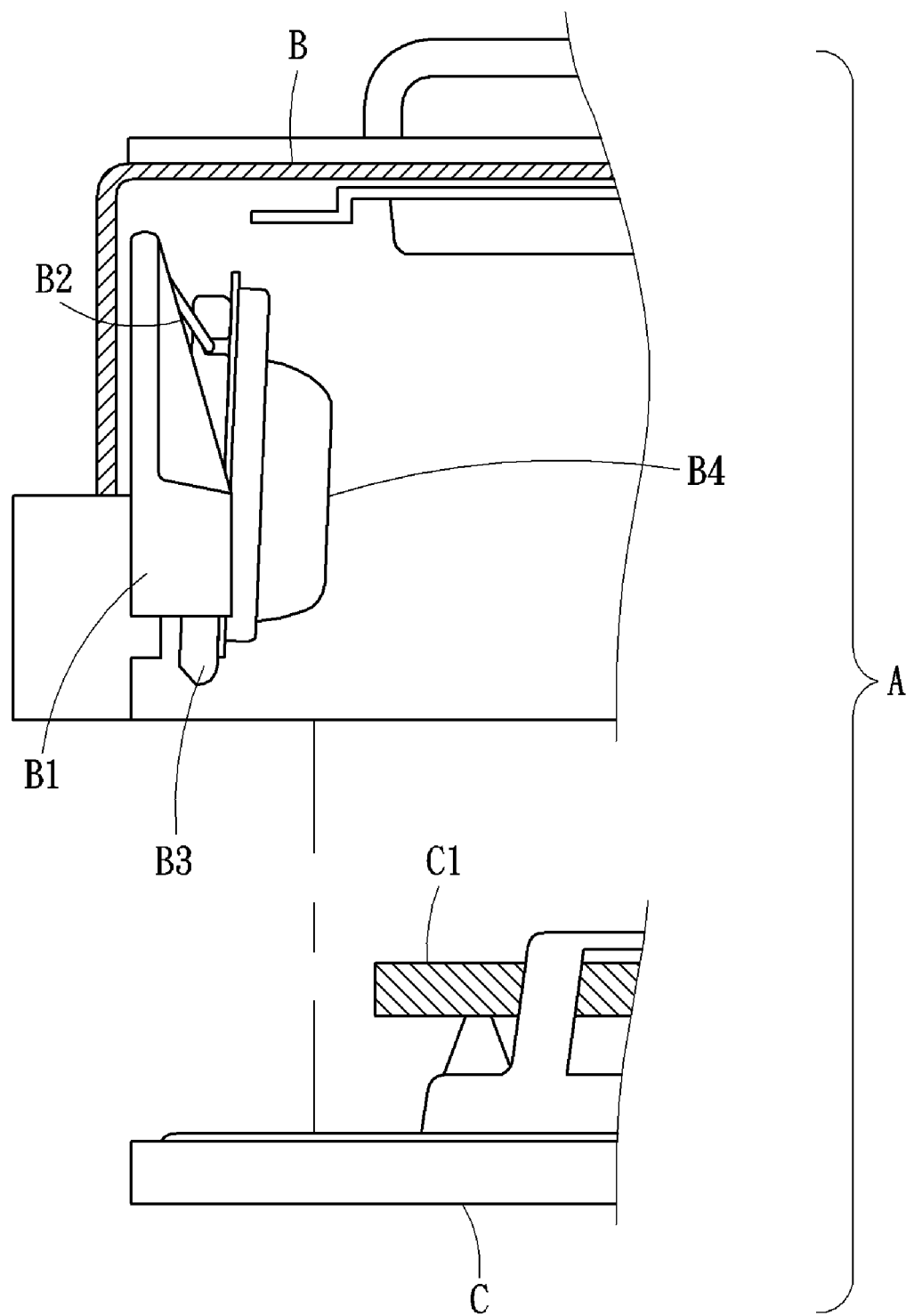
FIG. 9 is a side-view of a conventional art.
Figure 10:
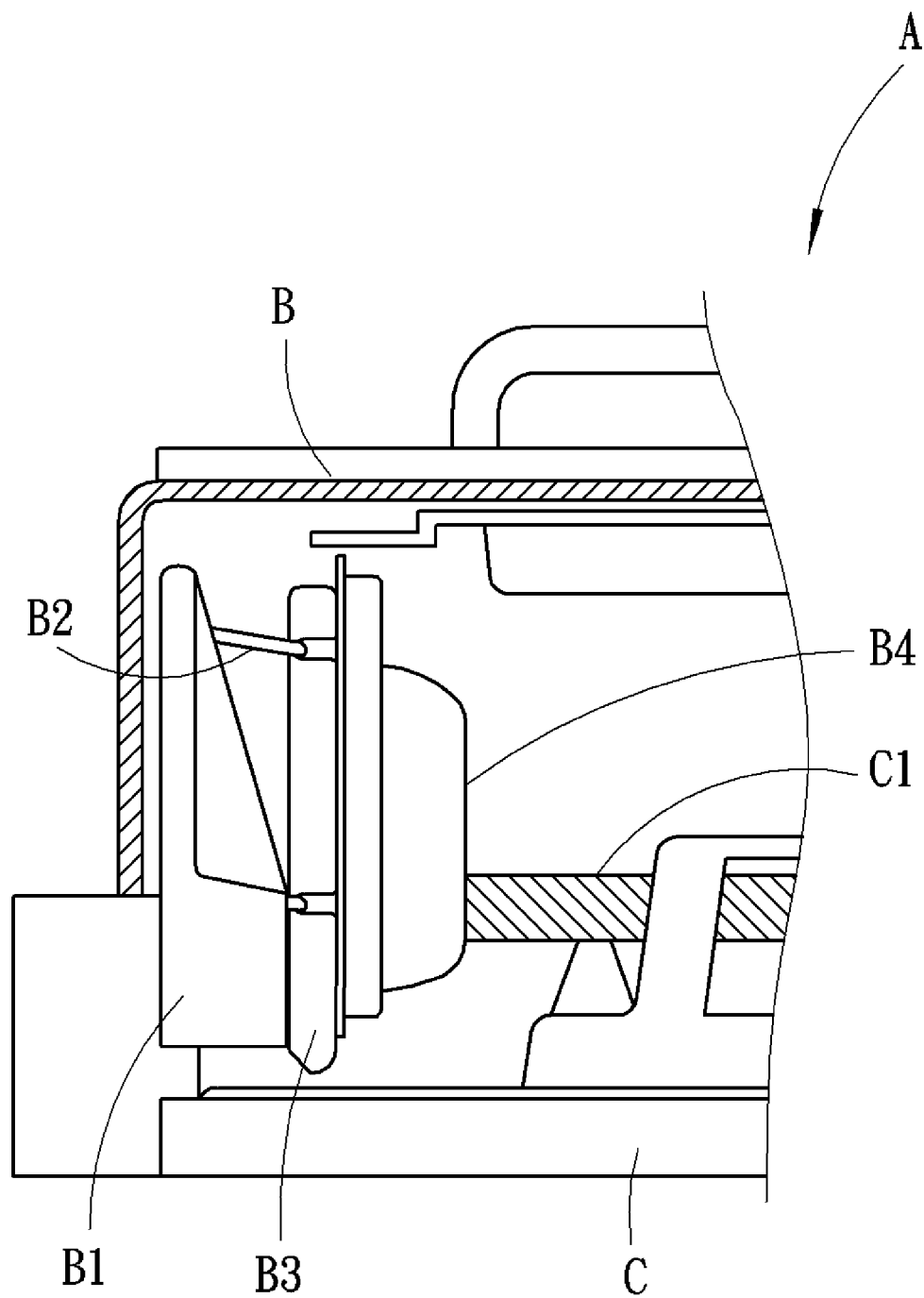
FIG. 10 is a side-view of a conventional art.

Referring to FIG. 8, the guiding surface 331 of the positioning device 3 can be pivoted with a pulley 332 to reduce generating of micro-fragments.

Furthermore, the positioning device 3 can be fabricated in a one-step process using rubber or plastic material.

According to the above description, the improved photomask positioning apparatus of the present invention is better than the prior art.

1. The positioning device 3 is set at two sides of the lid 2. When the lid 2 covers the substrate 1, and the photomask 4 in the substrate 1 can be placed between the positioning portions 33 of the positioning device 3. When opening the lid 2, the photomask 4 is positioned in a correct position to facilitate the robotic arm to take out without frictions with the fixing devices 11 set at the two sides of the substrate 1.

2. The positioning device 3 is fabricated by in one-step process using rubber or plastic material to effectively reduce the manufacture cost. When assembling, higher force can be used to jostle to embed the positioning slot 321 of the positioning device 3 into the positioning axle 211 of the lid 2 to effectively reduce assembling process time and increase the production throughput.

3. The positioning portions 33 of the positioning device 3 can limit the photomask 4 from moving and effectively clip the photomask 4 with the holding element 111 of the substrate 1 from top and bottom so that the photomask 4 can be positioned in a stable position within the photomask box.

4. The plurality of holding wheels 5231 on the central axis 523 of the holding device 5 are utilized to hold the side of the photomask 4 such that the holding wheels 5231 will not have friction with the side of the photomask 4, i.e. the micro-fragments will not be generated.

5. The shifting wheels 5221 of the shifting end 522 of the holding device 5 are adapted for holding the substrate 1. Also, the shifting wheels 5221 will not have friction with the substrate 1, and the micro-fragments will not be generated.

6. While the holding wheels 5231 of the holding device 5 hold against the side of the photomask 4, the connecting end 521 is fixed in the lid 2 and the shifting end 522 holds on the substrate 1 to form stable support so that the photomask 4 will not be shaken or offset and do not get damaged.

While the invention has been described in conjunction with a specific best mode, it is to understood that many alternatives, modifications, and variations will be apparent to those skilled in the art in light of the foregoing description. Accordingly, it is intended to embrace all such alternatives, modifications and variations in which fall within the spirit and scope of the included claims. All matters set forth herein or shown in the accompanying drawings are to be interpreted in an illustrative and non-limiting sense.

The invention claimed is:

1. A photomask positioning apparatus, for a photomask box having a substrate comprising fixing devices formed at two sides thereof, each fixing device having a holding element for holding against a photomask, one side of the holding element having a plurality of limiting plates, a lid covering a top of the substrate and the lid enclosing a containing space for receiving the photomask, the photomask positioning apparatus comprising:

a positioning device, respectively disposed at two sides of a bottom of the containing space, the positioning device comprising a base, one end of which comprises a bended fixed portion connected to a bottom of the containing space and the other end of which is away from the fixed portion comprises a banded positioning portion such that the photomask can be positioned between the positioning portions set at the two sides of the containing space, wherein the positioning portion of the positioning device comprises a guiding surface, and wherein pulleys are set on the guiding surface.

2. The photomask positioning apparatus of claim 1, wherein the fixed portion of the positioning device further comprises a positioning slot embedded in a positioning axle set at a bottom of the containing space.

3. The photomask positioning apparatus according to claim 1, wherein the positioning devices set at the two sides of the containing space can be one or more than one.

4. The photomask positioning apparatus according to claim 1, wherein the positioning devices is comprised of a rubber material.

5. The photomask positioning apparatus according to claim 1, wherein the positioning devices is comprised of a plastic material.

6. The photomask positioning apparatus according to claim 1, wherein the positioning devices are fabricated using a one-step process.

7. A photomask positioning apparatus, for a photomask box having a substrate comprising fixing devices formed at two sides thereof, each fixing device having a holding element for holding a photomask, a plurality of limiting plates set on one side of the holding element, a lid covering a top of the substrate and the lid enclosing a containing space for receiving the photomask, the photomask positioning apparatus comprising:

a holding device comprising a base and a holding portion, disposed one side of the containing space, wherein the base is fixed in the containing space, one side of which comprises a connecting element for setting a spindle set at a connecting end of the holding portion and other side away from the connecting end of the holding portion comprises a shifting end, and wherein a central axis connects the shifting end and the connecting end so that the holding portion can be rotated and shifted by the central axis to achieve an effect of holding.

8. The photomask positioning apparatus according to claim 7, wherein a plurality of holding wheels are set on the central axis connecting the connecting end and the shifting end of the holding portion.

9. The photomask positioning apparatus according to claim 8, wherein the plurality of holding wheels on the central axis is made of a soft material.

10. The photomask positioning apparatus according to claim 8, wherein the plurality of holding wheels on the central axis is made of a Polyetheretherketone (PEEK) plastic material.

11. The photomask positioning apparatus according to claim 7, wherein the shifting end of the holding portion comprises shifting wheels at other side thereof away from the central axis.

12. The photomask positioning apparatus according to claim 11, wherein the shifting wheels at one side of the shifting end is made of a soft material.

13. The photomask positioning apparatus according to claim 11, wherein the shifting wheels at one side of the shifting end is made of a Polyetheretherketone (PEEK) plastic material.

* * * * *